(12) United States Patent
Ota et al.

(10) Patent No.: US 8,674,492 B2
(45) Date of Patent: Mar. 18, 2014

(54) POWER MODULE

(71) Applicants: Tatsuo Ota, Tokyo (JP); Toshiaki Shinohara, Tokyo (JP); Mamoru Terai, Tokyo (JP); Hiroya Ikuta, Tokyo (JP)

(72) Inventors: Tatsuo Ota, Tokyo (JP); Toshiaki Shinohara, Tokyo (JP); Mamoru Terai, Tokyo (JP); Hiroya Ikuta, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/748,422

(22) Filed: Jan. 23, 2013

(65) Prior Publication Data

US 2013/0270688 A1 Oct. 17, 2013

(30) Foreign Application Priority Data

Apr. 11, 2012 (JP) .................................. 2012-090004

(51) Int. Cl.
    *H01L 23/52* (2006.01)
(52) U.S. Cl.
    USPC ............................ 257/678; 257/691; 257/707
(58) Field of Classification Search
    USPC ................... 257/678, 686, 691, 706, 707, 787
    See application file for complete search history.

(56) References Cited

U.S. PATENT DOCUMENTS

| 8,004,075 | B2 * | 8/2011 | Soga et al. | 257/687 |
| 2007/0290342 | A1 * | 12/2007 | Ishikawa | 257/737 |
| 2012/0080800 | A1 * | 4/2012 | Shinohara | 257/773 |
| 2012/0181682 | A1 * | 7/2012 | Soyano | 257/692 |
| 2013/0009298 | A1 | 1/2013 | Ota et al. | |
| 2013/0056883 | A1 * | 3/2013 | Furukawa | 257/782 |
| 2013/0105980 | A1 * | 5/2013 | Yasuda et al. | 257/772 |
| 2013/0240909 | A1 * | 9/2013 | Hiramatsu et al. | 257/77 |

FOREIGN PATENT DOCUMENTS

| JP | 02-260551 A | 10/1990 |
| JP | 03-173165 A | 7/1991 |
| JP | 04-320359 A | 11/1992 |
| JP | 2002-110872 A | 4/2002 |

* cited by examiner

*Primary Examiner* — S. V. Clark (74) *Attorney, Agent, or Firm* — Studebaker & Brackett PC (57) ABSTRACT

A power module according to the present invention is a power module configured such that a power device chip is arranged within an outer casing and an electrode of the power device chip is connected to an external electrode that is integrated with the outer casing. The power module includes: a heat spreader fixed inside the outer casing; the power device chip solder-bonded on the heat spreader; an insulating dam formed on the heat spreader so as to surround the power device chip; and an internal main electrode having one end thereof solder-bonded to the electrode of the power device chip and the other end thereof fixed to an upper surface of the dam. The external electrode and the other end of the internal main electrode are electrically connected to each other by wire bonding.

5 Claims, 5 Drawing Sheets

CRACKING (b)

(c)

POWER MODULE

BACKGROUND OF THE INVENTION

1. Field of the Invention

The present invention relates to a power module, and particularly relates to a power module configured such that a power device chip is arranged within an outer casing and an electrode of the power device chip is connected to an external electrode that is integrated with the outer casing.

2. Description of the Background Art

In a conventional power module, an electrode of a power device chip arranged on an insulating substrate placed within a module casing is connected to an external electrode of the module casing by wire bonding using a aluminum wire, or the like (for example, see Japanese Patent Application Laid-Open No. 2-260551).

There is a power module having a high reliability, in which an electrode of a power device chip and an external electrode of a module casing are connected to each other by DLB (direct lead bonding) instead of the wire bonding, and the power device chip is sealed by using a transfer mold technology.

The wire bonding mentioned above is a proven method that has been performed since the 1980s. However, the aluminum wire is directly bonded to a heat generator of the power device chip. Therefore, heat stress caused by a repetition of turning-on and turning-off of the power device chip is applied to the aluminum wire, and this heat stress directly influences a fatigue life. Accordingly, when priority is given to an increased life span, designing with a maximum rated bonding portion temperature being set low is necessary, but such designing involves a problem of an increased size and increased costs of the power module.

The transfer mold technology mentioned above has an excellent reliability and mass production properties, but requires a large initial investment because a mold, or the like, should be prepared. Additionally, the bonding with the DLB restricts the degree of freedom in a terminal shape and the size of the external electrode. Thus, there is a problem that the costs are significantly increased when products having different design sizes are manufactured in a small lot.

SUMMARY OF THE INVENTION

An object of the present invention is to provide a power module that achieves both of an increased life span and a high degree of freedom in designing with a low cost.

A power module according to the present invention is a power module configured such that a power device chip is arranged within an outer casing and an electrode of the power device chip is connected to an external electrode that is integrated with the outer casing. The power module according to the present invention includes a heat spreader fixed inside the outer casing, and the power device chip solder-bonded on the heat spreader. The power module according to the present invention further includes an insulating dam formed on the heat spreader so as to surround the power device chip, and an internal main electrode having one end thereof solder-bonded to the electrode of the power device chip and the other end thereof fixed to an upper surface of the dam. In the power module according to the present invention, the external electrode and the other end of the internal main electrode are electrically connected to each other by wire bonding.

In the present invention, the other end of the internal main electrode fixed to the upper surface of a wall of the dam has a lower temperature than a portion bonded to the power device chip. A wire is bonded to this portion having a relatively low temperature, for the connection to the external electrode. Thereby, heat stress received by the wire can be made relatively low. This can increase the life span of the wire, and thus an effect of an increased life span of the power module is obtained.

In the present invention, since the bonding between the internal main electrode and the electrode of the power device chip is implemented by solder-bonding, a wide bonding area is ensured, which enables heat of the power device chip to be efficiently dissipated. As a result, an effect of a further increased life span of the power module is obtained.

In the present invention, moreover, the connection between the internal main electrode and the external electrode of the outer casing is implemented by wire bonding. Therefore, limitations in the degree of freedom in a terminal shape and the size of the external electrode are eliminated. Thus, even though this preferred embodiment is applied to a small lot of various kinds of products, an increase in the manufacturing cost is suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

<Preferred Embodiment 1>
<Configuration>

Figure 1:
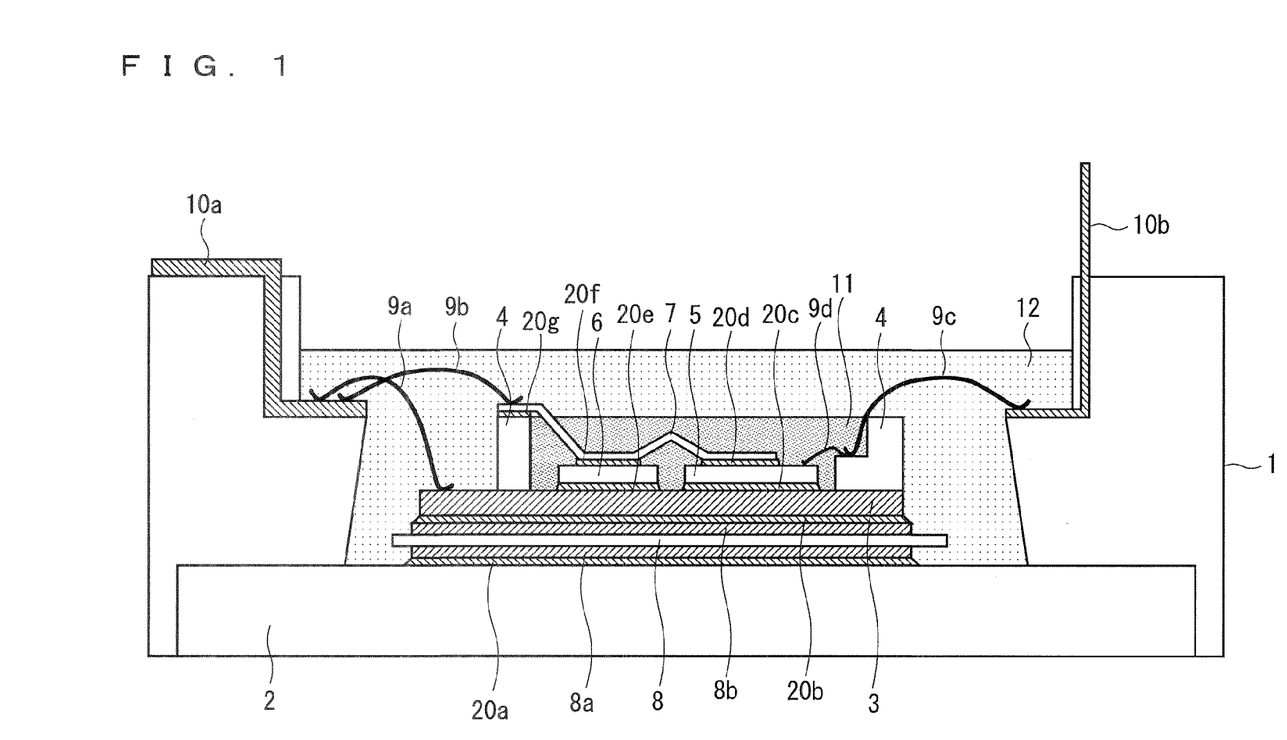
FIG. 1 shows a cross section of a power module according to a preferred embodiment 1.

FIG. 1 shows a cross section of a power module according to this preferred embodiment. The power module of this preferred embodiment is configured such that each electrode of a power device chip 5, which is provided on and electrically bonded to a heat spreader 3 arranged within an outer casing 1, is connected to an external electrode 10a, an external electrode (not shown) located behind the external electrode 10a, and an external signal electrode 10b. The external electrode 10a, the external electrode (not shown) located behind the external electrode 10a, and the external signal electrode 10b are integrated with the power module.

A current applied to the external signal electrode 10b is adjusted, and thereby the power device chip 5 is turned on and off, and a main current flowing between the external electrode 10a and the external electrode located behind the external electrode 10a is controlled.

For the power device chip 5, for example, a voltage-controlled power device such as an IGBT or a MOSFET is adopted. A freewheeling diode (hereinafter, FWD) 6 is connected in parallel with the power device chip 5. This is for ensuring a regenerative current path and protecting the power device chip 5.

In the following, a structure of the power module of this preferred embodiment will be described in detail. The outer casing 1 has a base plate 2 that serves as a lower surface of the outer casing 1. An insulating substrate is arranged on the base plate 2 with interposition of a solder bonding portion 20*a* therebetween. The insulating substrate is a ceramic insulating plate 8 having metal patterns 8*a* and 8*b* provided on both surface thereof. A material of the ceramic insulating plate 8 is silicone nitride ($Si_3N_4$), and the thickness thereof is 0.32 mm. A material of the metal pattern is copper, and the thickness thereof is 0.4 mm.

For the base plate 2, a metal material such as copper or aluminum, or a composite material such as AlSiC, may be adopted. In this preferred embodiment, copper is adopted, with a thickness of 3.5 mm.

The heat spreader 3 is provided on the insulating substrate with interposition of a solder bonding portion 20*b* therebetween. A material of the heat spreader 3 is copper, with a thickness of 1 mm or more and 2 mm or less.

The power device chip 5 is bonded on the heat spreader 3 with interposition of a solder bonding portion 20*c* therebetween. The FWD 6 is also bonded on the heat spreader 3 with interposition of a solder bonding portion 20*e* therebetween.

A dam 4 is formed on the heat spreader 3 so as to surround the power device chip 5 and the FWD 6. The dam 4 is formed of a stack of glass epoxy substrates. The dam 4 is formed such that the wall thereof is higher than a solder bonding portion 20*d* that bonds the power device chip 5 to an internal main electrode 7.

With the internal main electrode 7 that is for rendering the main current conducting, the power device chip 5 and the FWD 6 are connected in parallel with each other with interposition of solder bonding portions 20*d* and 20*f* therebetween. The other end of the internal main electrode 7 is drawn out onto an upper surface of the wall of the dam 4, and fixed thereto with interposition of a solder bonding portion 20*g* therebetween. Preferably, a material of the internal main electrode 7 is copper having excellent heat resistance properties.

A thick aluminum wire 9*b* connects the external electrode 10*a* to the other end of the internal main electrode 7 that is solder-bonded on the upper surface of the wall of the dam 4. A thick aluminum wire 9*a* connects the external electrode located behind the external electrode 10*a* to a part of the heat spreader 3 located outside the dam 4.

A thin aluminum wire 9*d* connects a control electrode of the power device chip 5 to a metal pattern provided on an upper surface of the dam 4. A thin aluminum wire 9*c* connects the metal pattern provided on the upper surface of the dam 4 to the external signal electrode 10*b*. Thereby, the control electrode of the power device chip 5 and the external signal electrode 10*b* of the outer casing 1 are connected to each other.

The interior of the dam 4 is filled with an epoxy resin 11, so that the power device chip 5, the FWD 6, and the solder bonding portions 20*d* and 20*f* are sealed. Additionally, the interior of the outer casing 1 is filled with a low elasticity sealant such as a silicone gel 12.

<Manufacturing Method>

The external electrode 10*a*, the external electrode located behind the external electrode 10*a*, and the external signal electrode 10*b* are formed in the outer casing 1 by insert molding or outsert molding. The base plate 2 is mounted to the lower surface of the outer casing 1.

The predetermined metal patterns 8*a* and 8*b* are formed on both surfaces of the ceramic insulating plate 8 by, for example, electroplating or etching. A resultant plate serves as the insulating substrate.

Then, the insulating substrate is fixed on the base plate 2 by solder bonding. Furthermore, the heat spreader 3 is fixed on the insulating substrate by solder bonding.

Then, the power device chip 5 and the FWD 6 are arranged on the heat spreader 3 by solder bonding. Additionally, epoxy substrates (printed substrates) are stacked on the heat spreader 3 so as to surround the power device chip 5 and the FWD 6, thus forming the dam 4. Here, the epoxy substrates are stacked at least until the height of the wall of the dam 4 exceeds the height of the solder bonding portion 20*d* that bonds the power device chip 5 to the internal main electrode 7.

The formation of the dam 4 is performed at the latest before the internal main electrode 7 is attached to the power device chip 5 and the FWD 6.

Then, the internal main electrode 7 is bonded to the power device chip 5, the FWD 6, and the upper surface of the wall of the dam 4 by solder bonding. The metal pattern has been preliminarily provided on the upper surface of the wall of the dam 4. The internal main electrode 7 is solder-bonded to this metal pattern.

Then, connection between the internal main electrode 7 and the external electrode 10*a* is performed. By wire bonding, the external electrode 10*a* and an end of the internal main electrode 7, which is fixed to the upper surface of the wall of the dam 4, are connected to each other through the thick aluminum wire 9*b*. Similarly, the external electrode located behind the external electrode 10*a* and the part of the heat spreader 3 located outside the dam 4 are connected to each other through the thick aluminum wire 9*a*.

By wire bonding, the control electrode of the power device chip 5 and the external signal electrode 10*b* are connected to each other through the thin aluminum wires 9*c* and 9*d* in tandem over the dam 4.

Then, by potting, the interior of the dam 4 is filled with the epoxy resin 11. The potting is performed at least up to the height at which the solder bonding portion 20*d* that bonds the power device chip 5 to the internal main electrode 7 is sealed.

Finally, a low elasticity sealant such as the silicone gel 12 is poured into the outer casing 1, to seal portions other than the epoxy resin 11. Sealing the interior of the outer casing 1 with the silicone gel 12 or the like is performed for the purpose of protecting the insulation of the aluminum wires and the like.

Bonding of the solder bonding portions 20*a*, 20*b*, 20*c*, 20*d*, 20*e*, 20*f*, and 20*g* is performed by using, for example, a solder plate or a solder pellet.

In this preferred embodiment, the material of the heat spreader 3 is copper, with a thickness of 1 mm or more and 2 mm or less. This setting of the material and size of the heat spreader 3 is most preferable from the viewpoint of trade-off between heat dissipation performance and heat stress applied to the solder bonding portion 20*b*. This is verified by experiments conducted by the inventors. Data obtained as a result of the experiments are shown in FIG. 2.

Figure 2:
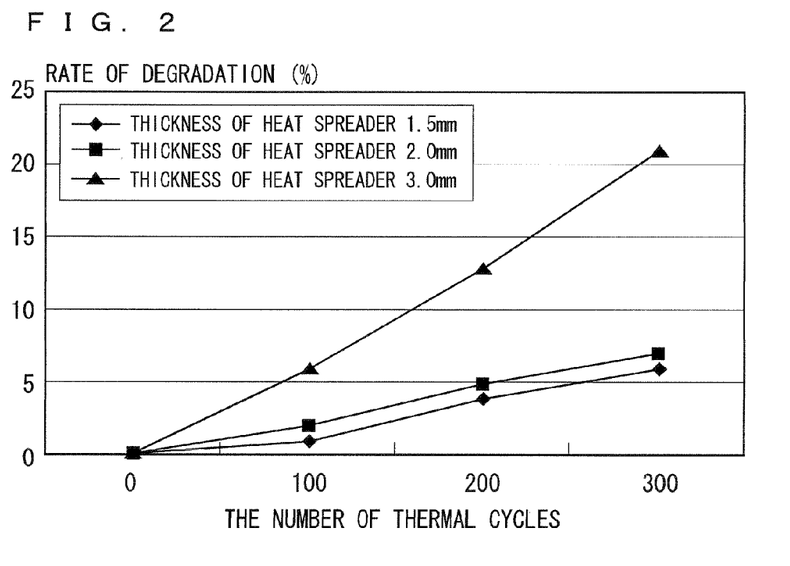
FIG. 2 shows the relationship between the thickness of a heat spreader and the rate of degradation of a solder.

FIG. 2 shows results obtained by repeating a thermal cycle of −40 to 150° C. up to 300 times on the heat spreaders 3 having different thicknesses and then examining the rate of degradation of the solder bonding portion 20*b*. As for the rate of degradation obtained when the number of cycles was 300, the rate of degradation had a high value of 20% or more in a case where the thickness was 3 mm. On the other hand, the rate of degradation had a low value of 10% or less in cases where the thickness was 1.5 mm and 2 mm. As the thickness decreased, the rate of degradation decreased. Accordingly, it can be estimated that, in a case where the thickness of the heat spreader 3 is set to be 1.0 mm, a low rate of degradation is exhibited similarly to the cases where the thickness is 1.5 mm and 2.0 mm. From the viewpoint of the heat dissipation performance, the heat spreader 3 needs a thickness of at least 1 mm. It is therefore believed that an optimum thickness of the heat spreader 3 is 1 mm or more and 2 mm or less.

Experiments conducted by the inventors have verified that, from the viewpoint of a fatigue life of the solder bonding portion 20a, it is preferable to design the base plate 2 and the insulating substrate under conditions that: the material of the base plate 2 is copper and the thickness thereof is 3.5 mm or less; the material of the ceramic insulating plate 8 is silicone nitride and the thickness thereof is 0.30 mm or more and 0.35 mm or less; and the material of the metal patterns 8a and 8b is copper and the thickness thereof is 0.3 mm or more and 0.5 mm or less. Results obtained by the experiments are shown in FIG. 3.

Figure 3:
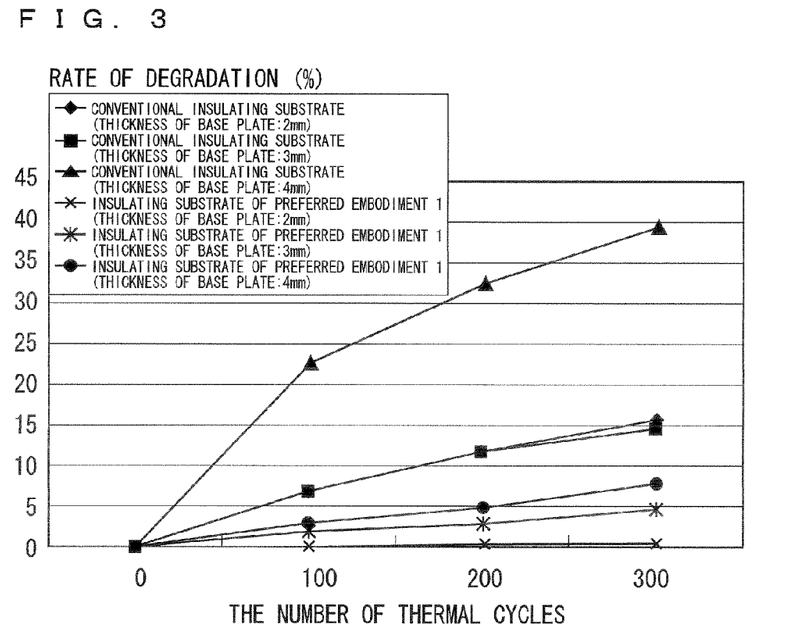
FIG. 3 shows the relationship between the thickness of a base plate and the rate of degradation of the solder.

FIG. 3 shows results obtained by changing the thickness of the base plate 2 in a conventional insulating substrate and the insulating substrate according to this preferred embodiment and then measuring the rate of degradation of the solder bonding portion 20a. The rate of degradation was measured after a thermal cycle of −40 to 150° C. was repeated up to 300 times. In the insulating substrate according to this preferred embodiment, aluminum nitride with a thickness of 0.32 mm was adopted for the ceramic insulating plate, and copper with a thickness of 0.4 mm was adopted for the metal patterns provided on both surfaces of the ceramic insulating plate. In the conventional insulating substrate, aluminum nitride with a thickness of 0.635 mm was adopted for the ceramic insulating plate, and copper with a thickness of 0.25 mm was adopted for the metal patterns provided on both surfaces of the ceramic insulating plate.

Referring to FIG. 3, from the data obtained when the thermal number of cycles was 300, it is seen that the rate of degradation of the insulating substrate according to this preferred embodiment is lower than that of the conventional insulating substrate irrespective of the thickness of the base plate 2. It is also seen that, in the insulating substrate according to this preferred embodiment, the rate of degradation decreased as the thickness of the base plate 2 decreased. Based on these experimental data, the inventors have determined that the rate of degradation can be sufficiently reduced by setting the thickness of the base plate 2 to be 3.5 mm or less. Accordingly, designing the base plate 2 and the insulating substrate with adoption of the above-mentioned size and material is preferable from the viewpoint of the fatigue life of the solder bonding portion 20a.

<Effects>

The power module according to this preferred embodiment is a power module configured such that the power device chip 5 is arranged within the outer casing 1 and the electrode of the power device chip 5 is connected to the external electrode 10a that is integrated with the outer casing 1. The power module includes: the heat spreader 3 fixed inside the outer casing 1; the power device chip 5 solder-bonded on the heat spreader 3; the insulating dam 4 formed on the heat spreader 3 so as to surround the power device chip 5; and the internal main electrode 7 having one end thereof solder-bonded to the electrode of the power device chip 5 and the other end thereof fixed to the upper surface of the dam 4. The external electrode 10a and the other end of the internal main electrode 7 are electrically connected to each other by wire bonding.

The other end of the internal main electrode 7 fixed to the upper surface of the wall of the dam 4 by solder-bonding has a lower temperature than a portion bonded to the power device chip 5. The thick aluminum wire 9b is bonded to this portion having a relatively low temperature, and thereby heat stress received by the thick aluminum wire 9b can be made relatively low. This can increase the life span of the thick aluminum wire 9b, and thus an effect of an increased life span of the power module is obtained.

Since the bonding between the internal main electrode 7 and the power device chip 5 is implemented by solder-bonding, a wide bonding area is ensured, which enables heat of the power device chip 5 to be efficiently dissipated. As a result, an effect of a further increased life span of the power module is obtained. Moreover, due to the efficient heat dissipation, a rise of the on-resistance of the power device chip 5 is suppressed. Thus, an effect of is a reduced power loss expected.

In the conventional technique in which an electrode of a power device chip and an external electrode of an outer casing are bonded to each other by DLB bonding, there are limitations in a terminal shape and the size of the external electrode. In this preferred embodiment, on the other hand, the connection to each external electrode (and more specifically, the external electrode 10a, the external electrode located behind the external electrode 10a, and the external signal electrode 10b) is implemented by wire bonding. Therefore, the limitations in the degree of freedom in the terminal shape and the size of the external electrode are eliminated. Thus, even though this preferred embodiment is applied to a small lot or various kinds of products, an increase in the manufacturing cost is suppressed.

In the power module according to this preferred embodiment: the dam 4 is formed higher than the power device chip 5 and the solder bonding portion 20d that bonds the power device chip 5 to the internal main electrode 7; and the interior of the dam 4 is filled with the epoxy resin 11, to seal the power device chip 5 and the solder bonding portion 20d that bonds the power device chip 5 to the internal main electrode 7.

By filling the interior of the dam 4 with the epoxy resin 11, the power device chip 5, the FWD 6, and the solder bonding portions 20d and 20f are sealed. This enables the power device chip 5 and the solder bonding portion 20d to be protected from heat stress caused by turning on and off of the power device chip 5, and thus an increased life span of the power module is expected. Additionally, potting is adopted to perform the sealing by utilizing the dam 4. This exerts the effect of a reduced manufacturing cost as compared with adopting the transfer mold technology to perform the sealing.

In the power module according to this preferred embodiment: the heat spreader 3 is fixed on the insulating substrate that is fixed on the base plate 2 serving as the lower surface of the outer casing 1; the insulating substrate is the ceramic insulating plate 8 having the metal patterns 8a and 8b provided on both surfaces thereof; the material of the heat spreader 3 is copper, and the thickness thereof is 1 mm or more and 2 mm or less; the material of the base plate 2 is copper, and the thickness thereof is 3.5 mm or less; the material of the ceramic insulating plate 8 is silicone nitride, and the thickness thereof is 0.30 mm or more and 0.35 mm or less; and the material of the metal patterns 8a and 8b is copper, and the thickness thereof is 0.3 mm or more and 0.5 mm or less.

Designing the heat spreader 3, the insulating substrate, and the base plate 2 in the above-mentioned manner can maximize the fatigue life of the solder bonding portions 20a and 20b. Thus, the effect of an increased life span of the power module is obtained.

<Preferred Embodiment 2>

Figure 4:
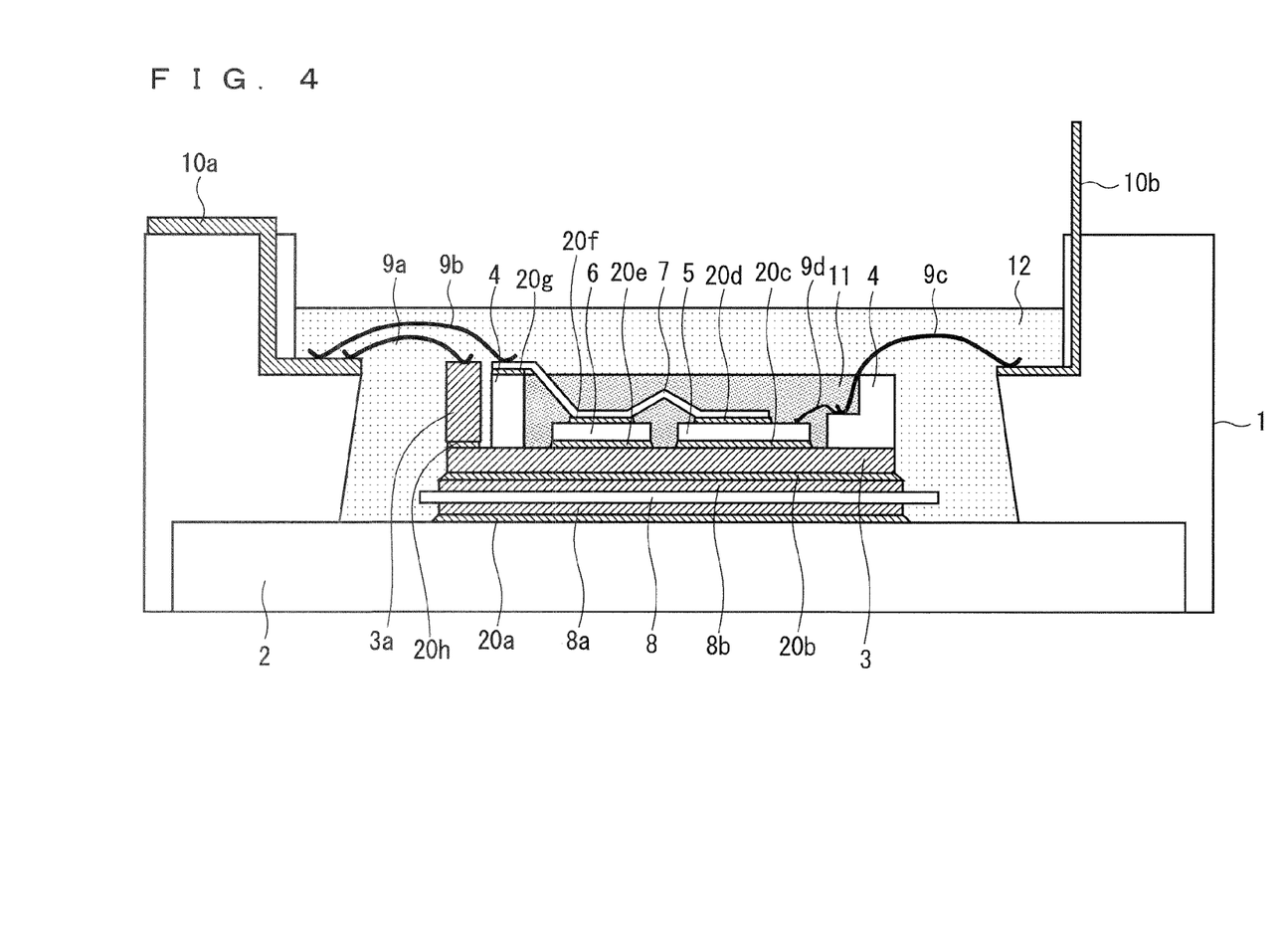
FIG. 4 shows a cross section of a power module according to a preferred embodiment 2.

FIG. 4 shows a cross section of a power module according to this preferred embodiment. In this preferred embodiment, instead of bonding the thick aluminum wire 9a directly on the heat spreader 3 as in the preferred embodiment 1 (FIG. 1), the thick aluminum wire 9a is bonded to an upper surface of a conductive electrode block 3a that is solder-bonded to the heat spreader 3. The other parts of the structure are the same as those of the preferred embodiment 1, and therefore descriptions thereof are omitted.

The electrode block 3a is bonded on a part of the heat spreader 3 located outside the dam 4, with interposition of the solder bonding portion 20f therebetween. The height of the electrode block 3a is the same as the height of the other end of the internal main electrode 7. From the viewpoint of the wire bonding, it is preferable that an error in the height is about ±0.3 mm. It is preferable that the material of the electrode block 3a is copper, which has an excellent thermal conductivity.

<Effects>

In the power module according to this preferred embodiment, the conductive electrode block 3a having the same height as that of the other end of the internal main electrode 7 is electrically bonded on the part of the heat spreader 3 located outside the dam 4; the upper surface of the electrode block 3a and the external electrode located behind the external electrode 10a, which is integrated with the outer casing 1, are electrically connected by each other wire bonding.

Accordingly, the heights of wire bonding surfaces to which the thick aluminum wires 9a and 9b are bonded are equal to each other. This eliminates the limitation in a movable range of a wire bonder, which has been caused by a difference in height between the bonding surfaces. Thus, as compared with the preferred embodiment 1 causing a difference in height between the wire bonding surfaces, the interval between wire bonding positions at which the thick aluminum wires 9a and 9b are bonded can be narrowed in the horizontal direction. Therefore, the width of the heat spreader 3 can be reduced, which allows the power module to be downsized.

<Preferred Embodiment 3>

Figure 5:
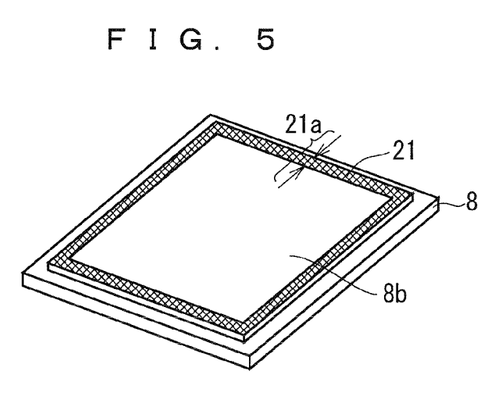
FIG. 5 shows an insulating substrate according to a preferred embodiment 3.

This preferred embodiment is different from the preferred embodiment 1 in that, in a bonding surface between the insulating substrate and the heat spreader 3 shown in FIG. 1, that is, in a bonding surface between the metal pattern 8b and the heat spreader 3, a solder resist 21 is applied in advance to an outer circumferential portion of the metal pattern 8b and then the solder-bonding is performed. The other parts are the same as those of the preferred embodiment 1, and therefore descriptions thereof are omitted.

FIG. 5 shows the bonding surface between the insulating substrate and the heat spreader 3. The metal pattern 8b is formed on the ceramic insulating plate 8. As shown in FIG. 1, the metal pattern 8b and the heat spreader 3 are bonded to each other with interposition of the solder bonding portion 20b therebetween.

Before the metal pattern 8b and the heat spreader 3 are solder-bonded, the solder resist 21 is applied in advance to the outer circumferential portion of the metal pattern 8b. Then, the metal pattern 8b is bonded to the heat spreader 3. This reduces a solder-bonding area of the solder bonding portion 20b as compared with not applying the solder resist 21.

When the insulating substrate is exposed to heat caused by turning on and off of the power device chip, a stress concentrates in a boundary portion between the ceramic insulating plate 8 and each of the metal patterns 8a and 8b because of a difference in coefficient of thermal expansion between the ceramic insulating plate 8 and the metal patterns 8a and 8b. This may cause cracking in the ceramic insulating plate 8.

Reducing the solder-bonding area in the solder bonding portion 20b as shown in this preferred embodiment can relieve the stress concentration in the boundary portion between the ceramic insulating plate 8 and each of the metal patterns 8a and 8b.

In this preferred embodiment, a width 21a of the outer circumferential portion of the metal pattern 8b to which the solder resist 21 is applied is set to be 1 mm or more and 2 mm or less. Experiments conducted by the inventors have verified that, when the width 21a of the outer circumferential portion is set in this range, cracking of the ceramic insulating plate 8 can be prevented without impairing the thermal conduction of the solder bonding portion 20b.

Figure 6:
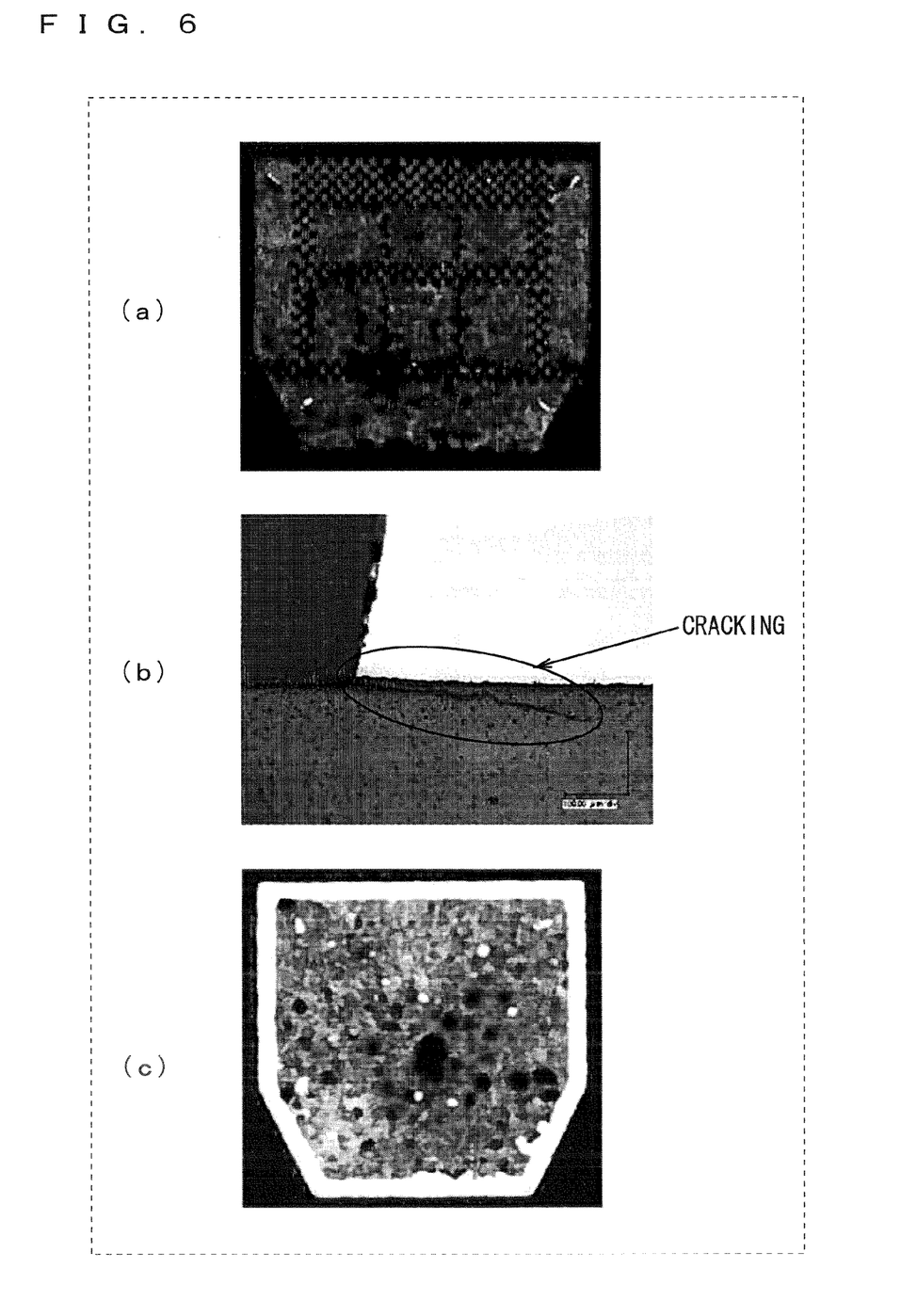
FIG. 6 shows photographs of the insulating substrate according to the preferred embodiment 3.

The part (a) of FIG. 6 shows a photograph of the insulating substrate in which the solder resist 21 is not applied to the outer circumferential portion of the metal pattern 8b. The part (c) of FIG. 6 shows a photograph of the insulating substrate in which the solder resist 21 is applied to the outer circumferential portion of the metal pattern 8b and the width 21a of the outer circumferential portion is set to be 1 mm or more and 2 mm or less. The part (b) of FIG. 6 shows a photomacrograph of a cross section of the ceramic insulating plate 8 shown in the part (a) of FIG. 6. In a case where the solder resist 21 is not applied to the outer circumferential portion of the metal pattern 8b, as shown in the part (b) of FIG. 6, cracking sometimes occurs in the ceramic insulating substrate 8. On the other hand, it is verified that, in a case where the solder resist 21 is applied to the outer circumferential portion of the metal pattern 8b and the width 21a of the outer circumferential portion is set to be 1 mm or more and 2 mm or less, occurrence of cracking is suppressed without impairing the thermal conduction of the solder bonding portion 20b.

<Effects>

In the power module according to this preferred embodiment: the solder resist 21 is applied to the outer circumferential portion of the bonding surface of the insulating substrate which is bonded to the heat spreader 3; the insulating substrate and the heat spreader 3 are fixed to each other by solder-bonding; and the width 21a of the outer circumferential portion is 1 mm or more and 2 mm or less.

Since the insulating substrate and the heat spreader 3 are solder-bonded after the solder resist 21 is applied to the outer circumferential portion of the metal pattern 8b, the solder-bonding area in the solder bonding portion 20b is reduced. This can relieve the stress concentration in the boundary portion between the ceramic insulating plate 8 and the metal patterns 8a and 8b. Accordingly, cracking of the ceramic insulating plate 8 due to the stress concentration can be prevented. Moreover, since the width 21a of the outer circumferential portion, to which the solder resist 21 is applied, is set to be 1 mm or more and 2 mm or less, cracking of the ceramic insulating plate 8 can be prevented without impairing the thermal conduction of the solder bonding portion 20b.

The preferred embodiments of the present invention can be combined in any manner and can be modified or omitted as appropriate as long as it is within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power module configured such that a power device chip is arranged within an outer casing and an electrode of said power device chip is connected to an external electrode that is integrated with said outer casing, said power module comprising:

a heat spreader fixed inside said outer casing;

said power device chip solder-bonded on said heat spreader;

an insulating dam formed on said heat spreader so as to surround said power device chip; and an internal main electrode having one end thereof solder-bonded to the electrode of said power device chip and the other end thereof fixed to an upper surface of said dam,
wherein said external electrode and said the other end of said internal main electrode are electrically connected to each other by wire bonding.

2. The power module according to claim 1, wherein
said dam is formed higher than said power device chip and a solder bonding portion that bonds said electrode of said power device chip to said internal main electrode,
the interior of said dam is filled with an epoxy resin, to seal said power device chip and said solder bonding portion that bonds said electrode of said power device chip to said internal main electrode.

3. The power module according to claim 1, wherein
said heat spreader is fixed on an insulating substrate that is fixed on a base plate serving as a lower surface of said outer casing,
said insulating substrate is a ceramic insulating plate having metal patterns provided on both surfaces thereof,
a material of said heat spreader is copper, and a thickness thereof is 1 mm or more and 2 mm or less,
a material of said base plate is copper, and a thickness thereof is 3.5 mm or less,
a material of said ceramic insulating plate is silicone nitride, and a thickness thereof is 0.30 mm or more and 0.35 mm or less,
a material of said metal patterns is copper, and a thickness thereof is 0.3 mm or more and 0.5 mm or less.

4. The power module according to claim 1, wherein
a conductive electrode block is electrically bonded on a part of said heat spreader located outside said dam, said conductive electrode block having the same height as that of said the other end of said internal main electrode,
an upper surface of said electrode block and said external electrode that is integrated with said outer casing are electrically connected to each other by wire bonding.

5. The power module according to claim 1, wherein
a solder resist is applied in advance to an outer circumferential portion of a bonding surface of said insulating substrate which is bonded to said heat spreader,
a width of said outer circumferential portion to which said solder resist is applied is 1 mm or more and 2 mm or less,
said heat spreader is fixed on said insulating substrate by solder-bonding.

* * * * *